(12) United States Patent
Rudmann et al.

(10) Patent No.: US 10,962,469 B2
(45) Date of Patent: Mar. 30, 2021

(54) MICROSYSTEM DEVICE COMPRISING INTEGRATED DESICCANT MONITORING

(71) Applicant: Albert-Ludwigs-Universität Freiburg, Freiburg (DE)

(72) Inventors: Linda Rudmann, Freiburg (DE); Michael Langenmair, Freiburg (DE); Juan Sebastian Ordonez, Ghent (BE); Thomas Stieglitz, Freiburg (DE)

(73) Assignee: ALBERT-LUDWIGS-UNIVERSITÄT FREIBURG, Freiburg (DE)

( * ) Notice: Subject to any disclaimer, the term of this patent is extended or adjusted under 35 U.S.C. 154(b) by 23 days.

(21) Appl. No.: 16/333,056

(22) PCT Filed: Sep. 8, 2017

(86) PCT No.: PCT/EP2017/001066
§ 371 (c)(1),
(2) Date: Mar. 13, 2019

(87) PCT Pub. No.: WO2018/050275
PCT Pub. Date: Mar. 22, 2018

(65) Prior Publication Data
US 2019/0265154 A1     Aug. 29, 2019

(30) Foreign Application Priority Data
Sep. 13, 2016   (DE) .................... 10 2016 011 046.5

(51) Int. Cl.
*G01N 19/10*     (2006.01)
*H05K 5/02*      (2006.01)
(Continued)

(52) U.S. Cl.
CPC ............. *G01N 19/10* (2013.01); *G01N 25/56* (2013.01); *H01L 23/26* (2013.01); *H05K 5/0213* (2013.01); *H05K 5/069* (2013.01)

(58) Field of Classification Search
CPC ........ G01N 19/10; G01N 25/56; H01L 23/26; H05K 5/0213; H05K 5/069
See application file for complete search history.

(56) References Cited

U.S. PATENT DOCUMENTS 5,968,386 A    10/1999 Goenka et al.
2006/0067645 A1 *  3/2006 Gally .................... G01M 3/229
                                                    385/147
(Continued)

FOREIGN PATENT DOCUMENTS

JP     2004-008968 A     1/2004

OTHER PUBLICATIONS

International Search Report for PCT/EP2017/001066, dated Apr. 5, 2018; English translation submitted herewith (8 pgs.).
(Continued)

*Primary Examiner* — David Z Huang
(74) *Attorney, Agent, or Firm* — Fitch, Even, Tabin & Flannery LLP

(57) ABSTRACT

A miniaturized microsystem device including at least one of electrical, optical and mechanical components in a hermetically or non-hermetically sealed housing with respect to air humidity or encapsulated, which contains a desiccant. The humidity-dependent lifetime of the arrangement is determined by measuring the absorptivity of the desiccant.

9 Claims, 1 Drawing Sheet

(51) Int. Cl.
H05K 5/06 (2006.01)
G01N 25/56 (2006.01)
H01L 23/26 (2006.01)

(56) References Cited

U.S. PATENT DOCUMENTS

2012/0235970 A1* 9/2012 Lavery .............. B81C 1/00285
345/211
2016/0161431 A1 6/2016 Stagg et al.

OTHER PUBLICATIONS

M. Moraja, M. Amiotti, ,,Advanced getter solutions at wafer level to assure high reliability to the last generations MEMS 41st Annual Reliability Physics Symposium, pp. 458-459, 2003.

G. E Loeb, R. A. Peck, W. H. Hoore, K. Hood, ,,B1ONTM system for distributed neural prosthetic interfaces, Medical Engineering & Physics, vol. 23, pp. 9-18, 2001.

H. Greenhouse, "Hermeticity of electronic packages," Noyes Publications, Park Ridge, New Jersey, USA; William Andrew Publishing, LLC, Norwich, New York, USA, 2000.

United States of America Department of Defense 2015, Test Method Standard Microcircuits, MIL-STD-883J. Available at http://www.dscc.dla.miVDownloads/MilSpec/Docs/M I L-STD-883/std883.pdf.

VIC Leak Detection MS-50 Datasheet.

Sensirion AG Datasheet SHT3x-DIS.

N. Dahan, N. Donaldson, S. Taylor, N. Sereno, ,,The application of PEEK to the Packaging of Implantable Electronic Devices: Water Permeation Calculation Methos and Maximum Achievable Lifetime with Desiccant, Journal of Microelectronics and Electronic Packaging, vol. 10, pp. 15-22, 2013.

M. Schuettler, A. Schatz, J. S. Ordonez, T. Stieglitz, ,,Ensuring Minimal Humidity Levels in Hermetic Implant Housings, 33rd Annual Int'l Conference of the IEEE EMBS, pp. 2296-2299, 2011.

M. Schuettler, T. Stieglitz, "Microassembly and micropackaging of implantable systems," Woodhead Publishing Series in Biomaterials, No. 52, pp. 108-149, 2013.

R. C. Kullberg, A. Jonath, R. K. Lowry, The Unsettled World of Leak Rate Physics: 1 Atm Large-Volume Considerations do Not Apply to MEMS Packages, a Practitioner's Perspective, in Proc. of SPIE, vol. 8250, 82500H, 2012.

M. Salimian et. al, "electrical conductivity of LTA-zeolite in the presence of poly(vinyl alcohol) and poly(vinyl pyrrolidone) polymers," Polym Int (Wiley Online Library), vol. 62, pp. 1583-1588, 2013.

* cited by examiner

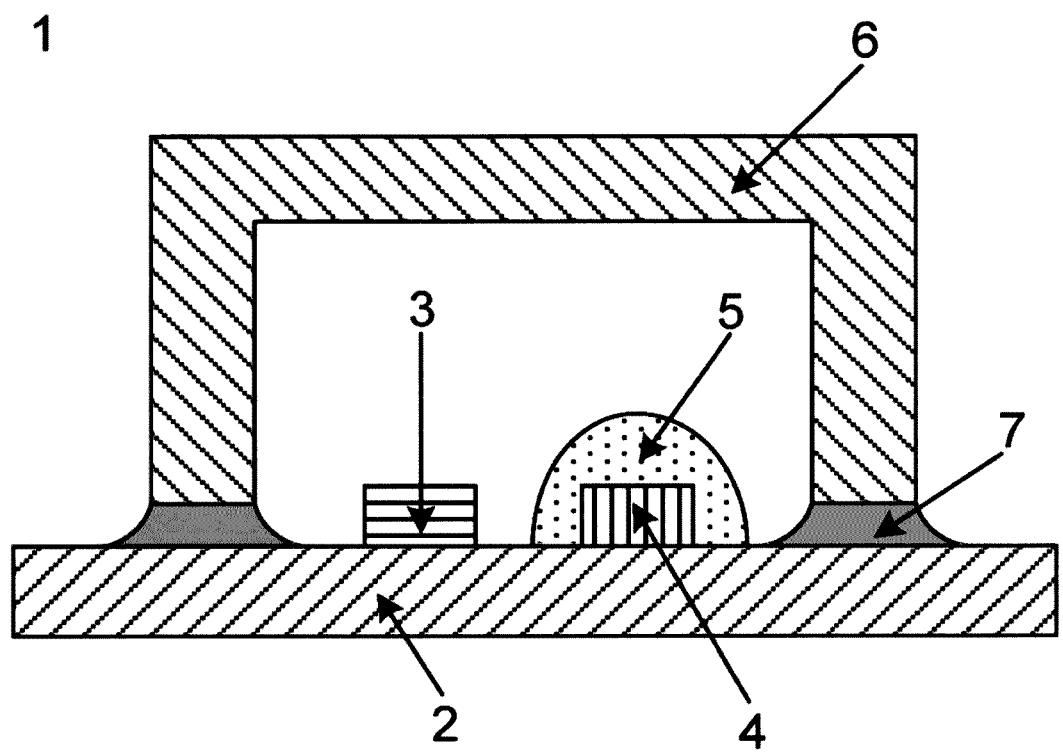

MICROSYSTEM DEVICE COMPRISING INTEGRATED DESICCANT MONITORING

CROSS REFERENCE TO RELATED APPLICATIONS

Reference is made to PCT/EP2017/001066 filed Sep. 8, 2017, and German Application No. 10 2016 011 046.5 filed Sep. 13, 2016, which are incorporated herein by reference in their entirety.

BACKGROUND OF THE INVENTION

Field of the Invention

The invention relates to desiccant monitoring.

Description of the Prior Art

Sensor, actuators and other electronic devices which interact with their surroundings usually contain at least one of electrical, optical and mechanical components. These components and at least one of the electrical and optical connections between them usually respond sensitively to the water vapor content of their surroundings. Water vapour can influence such devices and their components such as, for example, electronic circuits, light-emitting components or mechanical oscillation systems and irreversibly destroy them.

In many cases, it is found that the ambient humidity of the sensitive components is crucial for the predicted lifetime of the entire device. For the longest possible reliable operation of humidity-sensitive devices in the driest possible atmosphere, the following requirements are therefore imposed on the housing thereof which are the susceptible components must be packaged in a housing which is as impermeable as possible to water vapor penetrating from outside by hermetic or non-hermetic packaging, encapsulation or sealing. In addition, any condensation of water inside the housing must be avoided. The latter also applies to any water residues located in the housing although this housing must already be as free as possible from physically or chemically bound water upon closure. Since in reality these two criteria cannot be 100& satisfied, in many products which use a hermetic housing, activated desiccants are introduced into the sealed housing in addition to the functionally relevant components [references 1, 2].

In order to quantify the humidity-induced lifetime of electrical, optical or mechanical components, it is usual to set the least time lifetime interval to be up to when a volume concentration of 0.5% water vapor is achieved in a hermetically or non-hermetically sealed housing volume (critical water vapor concentration). This lifetime is usually calculated by determining the leak rate of water vapor per unit time into the housing [reference 3].

New products and product fields in medical technology, the automobile industry or entertainment electronics use increasingly smaller hermetically sealed housings. In these new smaller housing volumes compared to classical larger solutions, new challenges arise when determining the humidity-dependent lifetime of miniaturized microsystem devices. For example, the maximum permitted leak rates of water vapor per unit time into the housing can no longer be resolved by existing methods and devices. Also a direct measurement of the air humidity in the miniaturized housing is partially not possible since sensors having the required accuracy are too large. Indirect cumulative measurements of the water vapor leak rate in such hermetic or non-hermetically sealed devices allow higher sensitivities but as a result of the long test times cannot be considered for economic production processes.

The classical procedure for ensuring a humidity-dependent lifetime of the devices of at least 50 years with the aid of the water vapor leak rate into the hermetically or non-hermetically sealed housing can only be carried out robustly up to a minimal internal volume of the housing of 10 $mm^3$. Example: in order to fulfil the test method TM 1014.14 in [reference 4] over a period of more than 30 years, the leak rate of water vapor into a 0.125 $mm^3$ small housing must be <$10^{-14}$ $cm^3/s$. Established equipment can however only resolve a measurement range as far as a minimum of $10^{-13}$ $cm^3/s$ [reference 5].

Furthermore, the direct measurement of the air humidity in miniaturized hermetically or non-hermetically sealed housings (internal volume <1 $mm^3$) is not possible for space reasons and the non-availability of commercial sensors having sufficient precision. One of the few miniaturized sensors having sufficient precision at air humidities <10 rH % is the Sensirion SHT31, which for example, has a volume of 5.625 $mm^3$ [reference 6]. If a desiccant is additionally used which keeps the air humidity in the hermetically or non-hermetically sealed housing low, the internal air humidity barely changes until the desiccant saturates and is therefore difficult to observe by means of an air humidity sensor, as can be seen in [references 7, 8].

If the absorption rate of a desiccant is not very dependent on the current degree of absorption in the desiccant, the remaining absorption capacity of the desiccant cannot be inferred at any time. Example: if zeolite is used as desiccant in a hermetically or non-hermetically sealed housing, the absorptivity of the desiccant cannot be inferred using conventional methods for monitoring the humidity conditions in the implant (such as measurement of the room air humidity).

Also it is not possible to directly measure the air humidity in the hermetically or non-hermetically sealed housing if it is desired to fil the complete free internal volume of the housing with desiccant.

Currently Licensed measurement methods used so far to estimate the humidity-dependent lifetime of devices in hermetically or non-hermetically sealed housings can only be applied up to a minimum housing volume. Determining the humidity-dependent lifetime of devices in smaller hermetically sealed housings requires new measurement methods [reference 10]. In particular for devices which are not hermetically encapsulated, that is are sealed without any free hollow space, hitherto available methods for determining the humidity-dependent lifetime are only suitable to a limited extent. Since this housing has no free internal housing volume, for example it is not possible to use the TM 1014.14 test method. In non-hermetically encapsulated devices the components are for example completely potted in polymers of epoxides so that no more free internal housing volume is available.

SUMMARY OF THE INVENTION

The invention determines the lifetime of miniaturized microsystem devices comprising at least one of electrical optical and mechanical components as a function of the ambient humidity in hermetically or non-hermetically sealed housings or non-hermetically encapsulated devices.

This determination is solved according to the invention whereby in a miniaturized microsystem devices comprising at least one of electrical, optical and mechanical components in a hermetically or non-hermetically sealed housing with respect to air humidity or a non-hermetic encapsulation, a desiccant is introduced and the humidity-dependent lifetime of the device is determined by measuring the absorptivity of the desiccant.

The use of a desiccant is provided in many miniaturized microsystem devices in hermetically sealed housings. This desiccant can physically or chemically bind incoming moisture and thus significantly increase the humidity-dependent lifetime of the components located in the hermetic housing [reference 9]. Examples for physical desiccants are zeolites or silica gel. Zeolite can for example absorb water vapor up to 20% of the zeolite mass.

The absorptivity of many desiccants is dependent on the room air humidity surrounding the desiccant. By measuring the absorptivity of the desiccant, the room air humidity can therefore be inferred. As a result, any exceeding of the critical water vapor concentration can be at least one of measured and extrapolated, which corresponds to determining the lifetime of the electrical, optical or mechanical components.

The inventive determines the lifetime of the hermetically or non-hermetically housed miniaturized device which has the potential for a greater miniaturization and system integration than is possible for example with previous commercial air humidity sensors. It is possible for example to determine the absorption of the desiccant with a built-in microsystem planar sensor system. By use of this direct combination of a strongly miniaturized sensor system and a desiccant, synergy effects and space savings can be achieved which are not possible using previous commercial sensors for room air humidity.

By using desiccants which as a result of their absorption characteristics keep the room air humidity in hermetically or non-hermetically sealed housings constantly relatively low until they saturate, the continuously increasing absorptivity of the desiccant can be measured and recorded. For example, a saturation of the desiccant can thus be predetermined before a significant increase in the air humidity in the free hermetically or non-hermetically housed internal volume can occur as a result of saturation of the desiccant. In the case of non-hermetic encapsulations, use of such a system makes it possible for the first time continuous determination of the water content penetrating through the encapsulation.

Many previously used sensors for measuring the room air humidity also use a material whose water content is dependent on the ambient room air humidity. For example, the capacitive humidity sensor Sensirion SHT31 measures the water absorption of a built-in polymer membrane [reference 6]. The low water absorption of the thin polymer membrane barely influences the humidity conditions in the hermetically or non-hermetically sealed housing volume.

With the invention, the room air humidity-dependent moisture content of a material whose water absorption contributes to the functionality (increase in lifetime) of the remaining hermetic or non-hermetic system is determined for the first time.

By determining the water absorption of the desiccant, the lifetime in the hermetically or non-hermetically sealed housing is decoupled up to a certain degree from the humidity conditions in the remaining gas volume. For example, zeolite can keep the air humidity in the hermetically or non-hermetically sealed housing volume constantly low. With the device of the invention (hermetically or non-hermetically housed), therefore the (linear) increase in the physically bound quantity of water in the desiccant can be investigated, which the humidity content in the remaining housing internal volume remains constantly low. In the case of non-hermetically encapsulated devices in which no internal free housing volume is present, it is thus possible for the first time to know the actual water ingress through the encapsulation.

For the first time as a result of the invention, the free volume of the hermetically or non-hermetically sealed housing is not crucial for the measurability of the water ingress into the sealed housing. The volume in the hermetic or non-hermetic housing which is not occupied by the relevant components of the housing device can be completely filled with desiccant if it can be assumed that the bound water can be uniformly distributed in the desiccant. This can be made possible for example by using zeolite as desiccant since the moisture can be distributed in the material up to a certain degree [reference 11].

The invention also makes it possible to detect the saturation of a desiccant localized in a hermetically or non-hermetically sealed device. If the maximum absorption capacity of the desiccant is known, by monitoring the absorptivity of the desiccant, the degree of saturation of the same can be monitored. By means of the known absolute value of at least one of the absorptivity and the evaluation of the time profile of the absorptivity of the desiccant, a possible end of the water absorption capacity of the desiccant can be calculated in advance. As a result, an end of the lifetime (end of the lifetime defined as volume fraction of water vapor >0.5%) of the sealed device can be at least one of calculated, determined, or the level of the water content which has penetrated through the encapsulation of a non-hermetically encapsulated system can be determined.

The humidity-dependent lifetime of miniaturized hermetically or non-hermetically sealed device of the invention for at least one of electrical, optical and mechanical components can be determined which can no longer be resolved with classical established measurement systems.

The measurement of the absorption of the desiccant is a more precise integrated measurement of the absorption of the desiccant than a precise determination of the water vapor leak rate into the system.

By using the desiccant as a measurement substrate and as a water absorber, advantageous synergy effects and achieved and otherwise non-attainable space savings are made possible. If the water absorption of the desiccant which at the same time significantly increases the lifetime of the hermetically or non-hermetically housed device is measured, no additional sensor is required to observe the air humidity of the free housed volume. Thus, no free volume is required in the miniaturized hermetic housing.

By at least one of detecting and determining in advance the actual or future (imminent) saturation of the desiccant, an end of the lifetime of the hermetically or non-hermetically housed device can be at least one of determined and estimated. It is therefore possible to estimate the future (imminent) saturation of the desiccant also in the case of non-hermetically encapsulated systems.

BRIEF DESCRIPTION OF THE DRAWINGS

The invention is presented hereinafter without restricting the embodiment of the invention illustrated in FIG. 1. FIG. 1 is an example of a hermetic or non-hermetic housing with a free internal housing volume. A non-hermetically encapsulated devices is illustrated which has no free internal volume. That is, a non-hermetic material (for example polymer or epoxide) is applied directly to the electrical, optical or mechanical components and to the desiccant system.

DETAILED DESCRIPTION OF THE INVENTION

Reference Numeral List

1 Miniaturized microsystem device
2 Housing base
3 Electrical, optical or mechanical components
4 Measuring transducer
5 Desiccant
6 Housing cover
7 Seal The miniaturized microsystem arrangement (1) is arranged on a hermetic or non-hermetic housing base (2) with respect to air humidity. Electrical or other connections can be found between the hermetically or non-hermetically sealed housing internal volume and an external system in the housing base (2) or between housing base (2) and the housing cover (6). The housing base (2) can also be part of (6). At least one of electrical, optical and mechanical humidity-sensitive components (3) are present in the device (1). The measuring transducer (4) can be coupled electrically, optically or mechanically to the components (3) or be a part thereof. The measuring transducer (4) converts the absorption of the desiccant (5) into an electrical signal. This can, for example, be accomplished by impedance spectroscopy with varying at least one of measurement frequency ($\Delta f$) and measurement signal amplitude ($\Delta AC$), and average measured signal value ($\Delta DC$). It is also feasible to detect the change in the optical or mechanical properties of the desiccant as a function of the absorptivity. In this case, a relative absorption of the desiccant can be recorded from its dry weight, its weight when completely hydrated or an absolute weight. The sensor response can be read out and at least one of recorded telemetrically, optically or electrically.

For example, a structure can be developed, which by implementing comb capacitor structures, reads out electrotechnical parameters of the desiccant localized on these capacitor structures. In this case, electrotechnical parameters such as at least one of the electrical resistance, the resonance frequency, the complex impedance and the electrical capacity of the comb capacitor structures and the desiccant localized thereon can be read out.

For example, a physical desiccant can be used as desiccant (5). It is possible to use silica gel which has one of the highest water absorption capacities of known physical desiccants. Zeolite can be used in order to keep the moisture as low as possible for as long as possible. The desiccants can be located in a binder system (for example, polymer). The water absorption of the desiccant or of the desiccant-binder system can be measured by (4). By monitoring the desiccant, it is possible to deduce at least one of the air humidity in the hermetically, non-hermetically sealed housing, the degree of saturation of the desiccant and the desiccant-binder system. Thus, predictions can be made on the expected, actual and future humidity-dependent lifetime of the housed device and its components.

The desiccant is localized in the sealed housing volume. In this case, it can partially or completely fill the housing internal volume. The housing cover (6) can be made of at least one of the same material (2) or a different material from the housing base (2). Housing cover (6) can also be a non-hermetic material. Thus, for example, the housing cover (6) can be a completely enclosing non-hermetic material (that is a polymer). At least one of hermetic and non-hermetic material with respect to at least one of air humidity, electrical and other connections can exist between the housing internal volume and an external system in the housing. Seal (7) is a seal of the packaging (7). The seal (7) can also be a hermetic or non-hermetic material.

REFERENCES

[1] M. Moraja, M. Amiotti, "*Advanced getter Solutions at Wafer Level to Assure High Reliability to the Last Generations MEMS*" 41st Annual Reliability Physics Symposium, pp. 458-459, 2003.
[2] G. E Loeb, R. A. Peck, W. H. Hoore, K. Hood, "B1ONTM system for distributed neural prosthetic interfaces," Medical Engineering & Physics, vol. 23, pp. 9-18, 2001.
[3] H. Greenhouse, "*Hermeticity of Electronic Packages*," Noyes Publications, Park Ridge, N.J., USA; William Andrew Publishing, LLC, Norwich, N.Y., USA, 2000.
[4] United States of America Department of Defense 2015 TEST METHOD STANDARD Microcircuits, MIL-STD-883J. Available at http://www.dscc.dla.miVDownloads/MilSpec/Docs/MIL-STD-883/std883.pdf.
[5] VIC Leak Detection MS-50 Datasheet
[6] Sensirion AG *Datasheet SHT3x-DIS*.
[7] N. Dahan, N. Donaldson, S. Taylor, N. Sereno, "*The application of PEEK to the Packaging of Implantable Electronic Devices: Water Permeation Calculation Methos and Maximum Achievable Lifetime with Desiccant,*" Journal of Microelectronics and Electronic Packaging, vol. 10, pp. 15-22, 2013
[8] M. Schuettler, A. Schatz, J. S. Ordonez, T. Stieglitz, "*Ensuring Minimal Humidity Levels in Hermetic Implant Housings,*" 33rd Annual Int'l Conference of the IEEE EMBS, pp. 2296-2299, 2011.
[9] M. Schuettler, T. Stieglitz, "*Microassembly and Micropackaging of Implantable Systems*," Woodhead Publishing Series in Biomaterials, No. 52, pp. 108-149, 2013.
[10] R. C. Kullberg, A. Jonath, R. K. Lowry, "*The Unsettled World of Leak Rate Physics:* 1 *Atm Large-Volume Considerations do Not Apply to MEMS Packages, A Practitioner's Perspective*," in Proc. of SPIE, vol. 8250, 82500H, 2012.
[11] M. Salimian et. al, "*Electrical Conductivity of LTA-Zeolite in the Presence of Poly(Vinyl Alcohol) and Poly(Vinyl Pyrrolidone) Polymers,*" Polym Int (Wiley Online Library), vol. 62, pp. 1583-1588, 2013.

The invention claimed is:

1. A miniature device comprising:
   at least one of an electrical, an optical or a mechanical component in a housing that is not hermetic or is not hermetically sealed against air humidity, or is in an encapsulation that is not hermetically sealed against air humidity and in which the housing or the encapsulation contains a desiccant; and
   a measurement transducer in the housing or in the encapsulation and which measures a degree of absorption of the desiccant and the measurement transducer is configured to convert water absorption of the desiccant into an electrical signal with impedance spectroscopy.

2. The device according to claim 1, wherein:
   the measurement transducer comprises a capacitor disposed on a comb and the desiccant is located on the capacitor disposed on the comb.

3. A device according to claim 1, wherein:
the desiccant is at least one of the zeolite or silica gel.

4. A method for determining a moisture-dependent service life of a miniature device with at least one of an electrical, an optical, or a mechanical component in a housing that is not hermetic, or not hermetically sealed against air humidity, or is in an encapsulation that is not hermetically sealed against air humidity, comprising steps of:

measuring a degree of absorption of the desiccant contained in the housing or in the encapsulation by using a measurement transducer provided in the housing or in the encapsulation which converts water absorption of the desiccant into an electrical signal by using impedance spectroscopy; and determining or estimating moisture-dependent service life of the device by at least one of detection and predetermination of a saturation of the desiccant.

5. The method according to claim 4, comprising:

predicting or evaluating from a selective absorption capacity from at least one of an end point of a predicted water absorption capacity of the desiccant and a timewise profile of the degree of absorption of the desiccant.

6. The method according to claim 5, comprising:

determining an end point of the service life of the sealed device with the end point of the service life being defined by a volume fraction of water vapor that is >0.5% in a sealed housing.

7. The method according to claim 6, comprising:

at least one of reading or recoding a sensor response by using one of telemetrics, optics or electronics.

8. The method according to claim 4, comprising:

measuring and recoding an increase in a degree of absorption of the desiccant in the encapsulation and determining therefrom water content in the encapsulation.

9. The method according to claim 8, comprising:

converting water absorption of the desiccant into the electrical signal by performing the impedance spectroscopy with at least one of the changing measurement of amplitude and an average measurement of the electrical signal value.

* * * * *